(12) United States Patent
Wu et al.

(10) Patent No.: US 12,720,925 B2
(45) Date of Patent: Aug. 25, 2026

(54) ELECTRONIC DEVICE AND MANUFACTURING METHOD THEREOF

(71) Applicant: InnoLux Corporation, Miao-Li County (TW)

(72) Inventors: Shang-Ru Wu, Miao-Li County (TW); Shuai Wang, Miao-Li County (TW); Hua-Pin Chen, Miao-Li County (TW); Chien-Hao Kuo, Miao-Li County (TW); Yuan-Yi Sung, Miao-Li County (TW); Ta-Wei Huang, Miao-Li County (TW)

(73) Assignee: INNOLUX CORPORATION, Miao-Li County (TW)

( * ) Notice: Subject to any disclaimer, the term of this patent is extended or adjusted under 35 U.S.C. 154(b) by 638 days.

(21) Appl. No.: 18/186,291

(22) Filed: Mar. 20, 2023

(65) Prior Publication Data

US 2023/0343902 A1 Oct. 26, 2023

(30) Foreign Application Priority Data

Apr. 21, 2022 (CN) ......................... 202210422240.5

(51) Int. Cl.
*H10H 20/841* (2025.01)
*H10H 20/01* (2025.01)
*H10W 90/00* (2026.01)

(52) U.S. Cl.
CPC .......... *H10H 20/841* (2025.01); *H10W 90/00* (2026.01); *H10H 20/034* (2025.01)

(58) Field of Classification Search
CPC ............... H10H 20/841; H10H 20/034; H10H 20/0362; H10H 20/0363; H10H 20/856; H10H 20/853; H01L 25/0753
See application file for complete search history.

(56) References Cited

U.S. PATENT DOCUMENTS 6,476,551 B1 * 11/2002 Osawa ................ H01L 25/0753 313/506
8,597,964 B2 12/2013 Ke et al.
(Continued)

FOREIGN PATENT DOCUMENTS

CN 103017011 A 4/2013
TW M362428 U 8/2009
(Continued)

OTHER PUBLICATIONS

Chinese language office action dated May 16, 2025, issued in application No. TW 111146346.

*Primary Examiner* — Steven B Gauthier
*Assistant Examiner* — Khatib A Rahman
(74) *Attorney, Agent, or Firm* — McClure, Qualey & Rodack, LLP

(57) ABSTRACT

An electronic device and a manufacturing method thereof are provided. The electronic device includes a substrate, a plurality of light-emitting elements, and a reflective structure. A plurality of light-emitting elements is disposed on the substrate. The reflective structure is disposed on the substrate and located between adjacent two of the plurality of light-emitting elements. The thickness of the reflective structure is designated as Y1, half of a pitch between the adjacent two of the plurality of light-emitting elements is designated as X1, and the light that is emitted by one of the adjacent two of the plurality of light-emitting elements has an emitting angle, and half of the emitting angle is designated as θ. X1, θ, and Y1 conform to the following relationship: $X1\times0.5\times\tan(90-\theta)\leq Y1\leq X1\times1.8\times\tan(90-\theta)$.

16 Claims, 10 Drawing Sheets

(56) References Cited

U.S. PATENT DOCUMENTS

| | | | | |
|---|---|---|---|---|
| 11,829,030 | B2 * | 11/2023 | Yu | G02F 1/133603 |
| 11,862,761 | B2 * | 1/2024 | Peng | H10H 20/856 |
| 12,027,550 | B2 * | 7/2024 | Wu | G06V 10/143 |
| 12,166,023 | B2 * | 12/2024 | Peng | H10H 20/856 |
| 2021/0310632 | A1 * | 10/2021 | Yamada | F21V 7/0083 |
| 2022/0140211 | A1 * | 5/2022 | Shirahama | H10H 20/856<br>257/88 |
| 2023/0266616 | A1 * | 8/2023 | Hsu | G02F 1/1336<br>362/97.1 |

FOREIGN PATENT DOCUMENTS

| | | | |
|---|---|---|---|
| TW | 201116900 | A | 5/2011 |
| TW | 201308681 | A1 | 2/2013 |

* cited by examiner

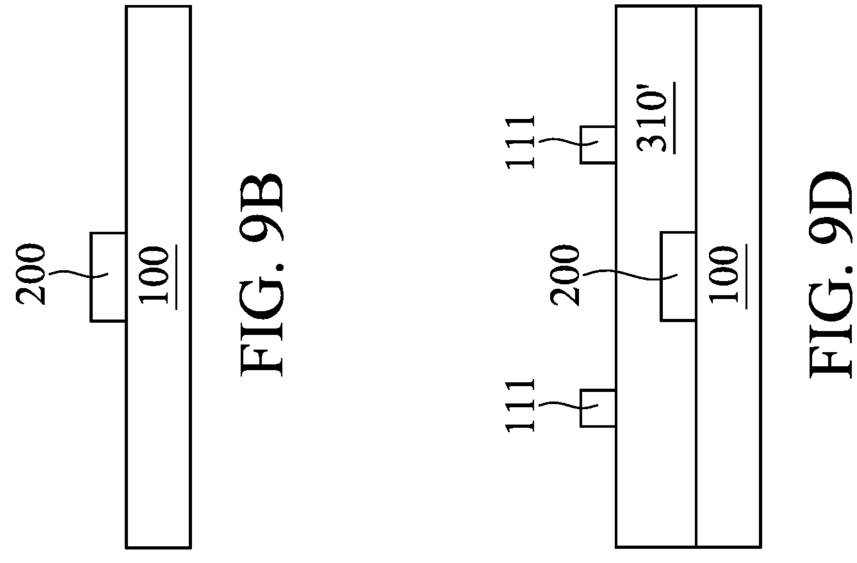
FIG. 9B
FIG. 9D
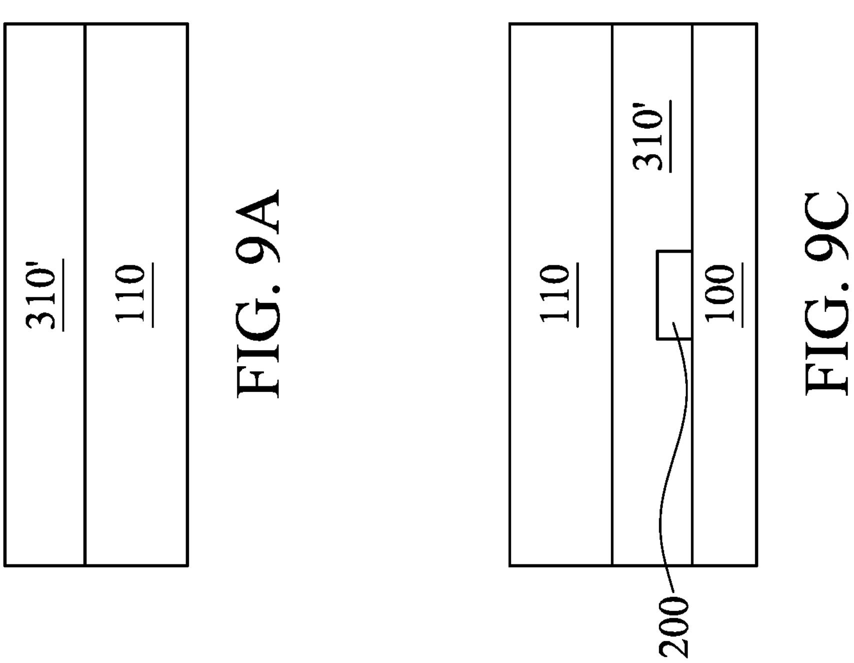
FIG. 9A
FIG. 9C

ELECTRONIC DEVICE AND MANUFACTURING METHOD THEREOF

CROSS REFERENCE TO RELATED APPLICATIONS

This application claims the priority of China Patent Application No. 202210422240.5, filed on Apr. 21, 2022, the entirety of which is incorporated by reference herein.

TECHNICAL FIELD

The present disclosure relates to an electronic device and a manufacturing method thereof, and, in particular, to an electronic device with a reflective structure, and a manufacturing method thereof.

BACKGROUND

An electronic device includes a light-emitting element.

Current electronic devices are usually coated with reflective paint such as white paint to improve the light scattering and/or reflective capabilities of the electronic devices. However, limited by the coating process of the reflective paint, the size (the height, the shape) of the reflective paint is limited, and the electronic device cannot be further improved.

Therefore, there are still some problems to be overcome with respect to the electronic device and manufacturing method thereof.

SUMMARY

In some embodiments, an electronic device is provided. The electronic device includes a substrate, a plurality of light-emitting elements, and a reflective structure. A plurality of light-emitting elements is disposed on the substrate. The reflective structure is disposed on the substrate and located between adjacent two of the plurality of light-emitting elements. Wherein, the thickness of the reflective structure is designated as Y1, half of the pitch between the adjacent two of the plurality of light-emitting elements is designated as X1, and the light emitted by one of the adjacent two of the plurality of light-emitting elements has an emitting angle. Half of the emitting angle is designated as θ, and X1, θ, and Y1 conform to the following relationship:

$$X1\times 0.5\times \tan(90-\theta)\leq Y1\leq X1\times 1.8\times \tan(90-\theta).$$

In some embodiments, an electronic device is provided. The electronic device includes a substrate, a plurality of light-emitting elements, a reflective structure, and a reflective microstructure. The plurality of light-emitting elements is disposed on the substrate. The reflective structure is disposed on the substrate. The reflective structure is located between adjacent two of the plurality of light-emitting elements. The reflective microstructure is disposed on the reflective structure.

In some embodiments, a method of manufacturing an electronic device is provided. The method of manufacturing an electronic device includes providing a substrate. A plurality of light-emitting elements is disposed on the substrate. A reflective material is disposed on the substrate and the plurality of light-emitting elements. The reflective material is patterned by a photolithography process to form a reflective structure between adjacent two of the plurality of light-emitting elements.

BRIEF DESCRIPTION OF THE DRAWINGS

FIGS. 9A to 9F show schematic cross-sectional views of electronic devices at different stages of the manufacturing process, according to some embodiments of the present disclosure.

DETAILED DESCRIPTION

Figure 1:
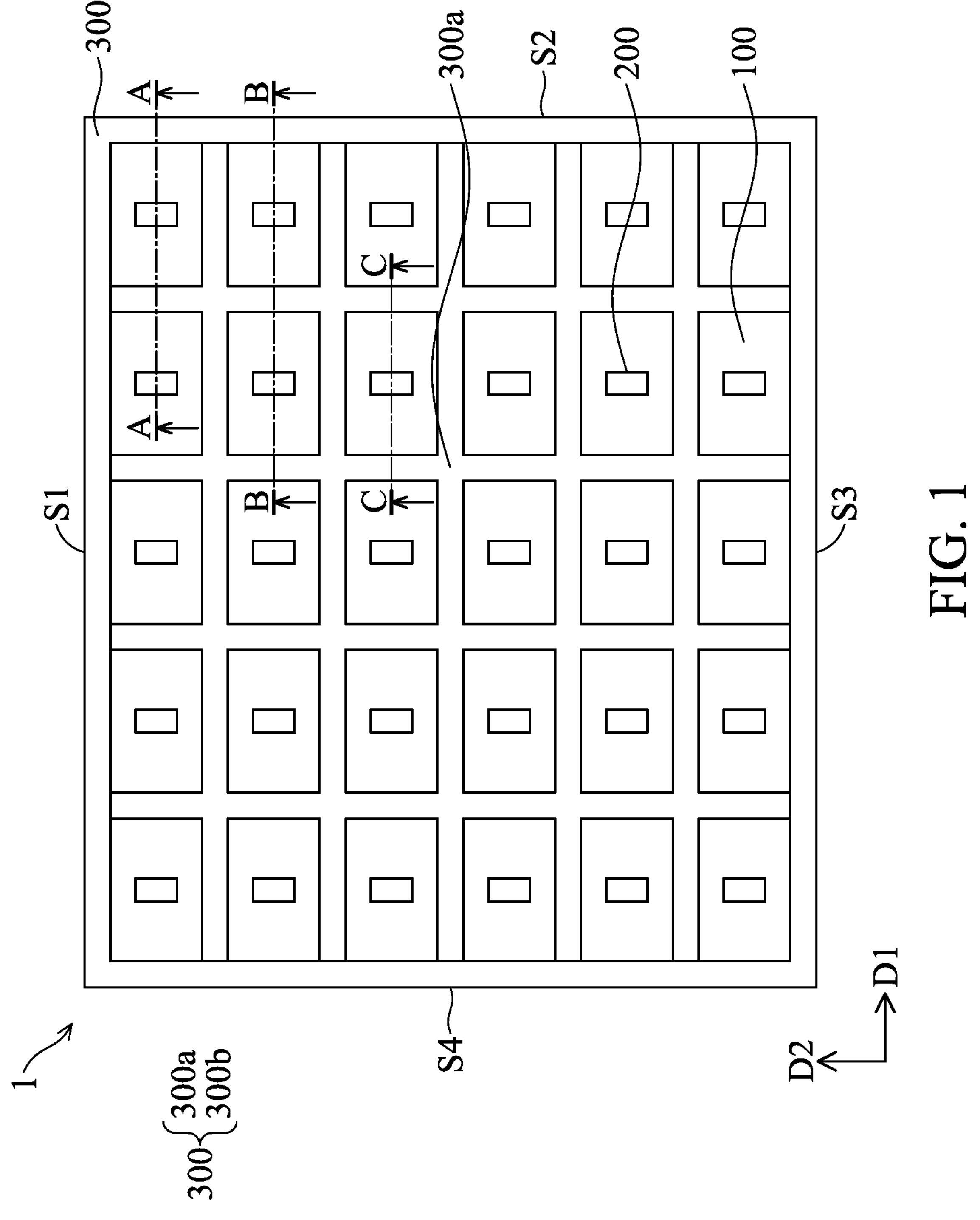
FIG. 1 shows a schematic top view of an electronic device, according to some embodiments of the present disclosure.

Electronic devices of embodiments of the present disclosure will be described in detail below. It should be understood that the following description provides many different embodiments for implementing various aspects of some embodiments of the present disclosure. The specific elements and arrangements described below are merely to clearly describe some embodiments of the present disclosure. Of course, these are only used as examples rather than limitations of the present disclosure. Furthermore, similar and/or corresponding reference numerals may be used in different embodiments to designate similar and/or corresponding elements, in order to clearly describe the present disclosure. However, the use of these similar and/or corresponding reference numerals is only for the purpose of simply and clearly describing some embodiments of the present disclosure, and does not imply any correlation between the different embodiments and/or structures discussed.

It should be understood that relative terms, such as "lower", "bottom", "higher" or "top" may be used in embodiments to describe the relative relationship of one element of the drawings to another element. It will be understood that if the device in the drawings were turned upside down, elements described on the "lower" side would become elements on the "upper" side. The embodiments of the present disclosure may be understood together with the drawings, and the drawings of the present disclosure are also regarded as a portion of the disclosure. It should be understood that the drawings of the present disclosure are not drawn to scale and, in fact, the dimensions of elements may be arbitrarily enlarged or reduced in order to clearly show the features of the present disclosure.

Furthermore, when it is mentioned that a first material layer is located on or over a second material layer, it may include the embodiment which the first material layer and the second material layer are in direct contact and the embodiment which the first material layer and the second material layer are not in direct contact with each other, that is one or more layers of other materials is between the first material layer and the second material layer. However, if the first material layer is directly on the second material layer, it means that the first material layer and the second material layer are in direct contact.

In addition, it should be understood that ordinal numbers such as “first”, “second” and the like used in the description and claims are used to modify elements and are not intended to imply and represent the element(s) have any previous ordinal numbers, and do not represent the order of a certain element and another element, or the order of the manufacturing method, and the use of these ordinal numbers is only used to clearly distinguished an element with a certain name and another element with the same name. The claims and the specification may not use the same terms, for example, a first element in the specification may be a second element in the claim.

In some embodiments of the present disclosure, terms related to bonding and connection, such as “connect”, “interconnect”, and the like, unless otherwise defined, may refer to two structures in direct contact, or they may refer to two structures that are not in direct contact, there being another structure disposed between the two structures. Terms related to bonding and connection may also include embodiments in which both structures are movable, or both structures are fixed. Furthermore, the terms “electrically connected” or “electrically coupled” include direct and indirect means of electrical connection.

Herein, the terms “about” and “substantially” generally mean within 10%, within 5%, within 3%, within 2%, within 1%, or within 0.5% of a given value or range. The given value is an approximate value, that is, “about”, and “substantially” may still be implied without the specific description of “about” and “substantially”. The phrase “a range between a first value and a second value” means that the range includes the first value, the second value, and other values in between. Furthermore, any two values or directions used for comparison may have certain tolerance. If the first value is equal to the second value, it implies that there may be a tolerance within about 10% between the first value and the second value. If the first direction is perpendicular to or approximately perpendicular to the second direction, the angle between the first direction and the second direction may be between 80 degrees and 100 degrees. If the first direction is parallel to or approximately parallel to the second direction, the angle between the first direction and the second direction may be between 0 degrees and 10 degrees.

Certain terms may be used throughout the specification and claims in this disclosure to refer to specific elements. A person of ordinary skills in the art should be understood that electronic device manufacturers may refer to the same element by different terms. This disclosure does not intend to distinguish between elements that have the same function but with different terms. In the following description and claims, terms such as “comprising”, “including” and “having” are open-ended words, so they should be interpreted as meaning “including but not limited to . . . ”. Therefore, when the terms “comprising”, “including” and/or “having” is used in the description of the present disclosure, it designates the presence of corresponding features, regions, steps, operations and/or elements, but does not exclude the presence of one or more corresponding features, regions, steps, operations and/or elements.

It should be understood that, in the following embodiments, features in several different embodiments may be replaced, recombined, and bonded to complete other embodiments without departing from the spirit of the present disclosure. The features of the various embodiments may be used in any combination as long as they do not violate the spirit of the disclosure or conflict with each other.

In some embodiments, the electronic device of the present disclosure may include a display device, a back light device, an antenna device, a sensing device, a tiled device, a touch display device, a curved display device, and a free shape display device, but the present disclosure is not limited thereto. The electronic device may include, for example, liquid crystal, light-emitting diodes, fluorophors, phosphors, other suitable display media, or a combination thereof, but the present disclosure is not limited thereto. The display device may be a non-self-luminous display device or a self-luminous display device. The antenna device may be a liquid crystal antenna device or a non-liquid crystal antenna device. The sensing device may be a sensing device for sensing capacitance, light, heat, or ultrasonic waves, but the present disclosure is not limited thereto. The electronic element may include passive elements and active elements, such as capacitors, resistors, inductors, diodes, transistors, and the like. The diodes may include light-emitting diodes or photodiodes. The light-emitting diodes may include, for example, organic light-emitting diodes (OLEDs), mini light-emitting diodes (mini LEDs), micro light-emitting diodes (micro LEDs), or quantum dot light-emitting diodes (quantum dot LED), but the present disclosure is not limited thereto. The tiled device may be, for example, a display tiled device or an antenna tiled device, but the present disclosure is not limited thereto. It should be noted that, the electronic device may be any arrangement and combination of the foregoing, but the present disclosure is not limited thereto. In addition, the electronic device may be a foldable or flexible electronic device. Further, the shape of the electronic device may be rectangular, circular, polygonal, a shape with curved edges, or another suitable shape. The electronic device may have a peripheral system, such as a driving system, a control system, a light source system, a shelf system, and the like to support the display device, the antenna device, or the tiled device. For the convenience of description, an example in which the electronic device is a backlight device is described below, but the present disclosure is not limited thereto.

Unless otherwise defined, all terms (including technical and scientific terms) used herein have the same meaning as commonly understood by a person of ordinary skills in the art. It should be understood that these terms, such as those defined in commonly used dictionaries, should be interpreted as having meanings consistent with the relevant art and the background or context of the present disclosure, and should not be interpreted in an idealized or overly formal manner, unless otherwise defined in the embodiments of the present disclosure.

Herein, the respective directions are not limited to three axes of the rectangular coordinate system, such as the X-axis, the Y-axis, and the Z-axis, and may be interpreted in a broader sense. For example, the X-axis, the Y-axis, and the Z-axis may be approximately perpendicular to each other, or may represent different directions that are not perpendicular to each other, but the present disclosure is not limited thereto. For convenience of description, hereinafter, the X-axis direction is the first direction D1 (the width direction), the Y-axis direction is the second direction D2 (the length direction), and the Z-axis direction is the third direction D3 (the thickness direction). In some embodiments, the third direction D3 is the normal direction of the substrate.

Figure 2:
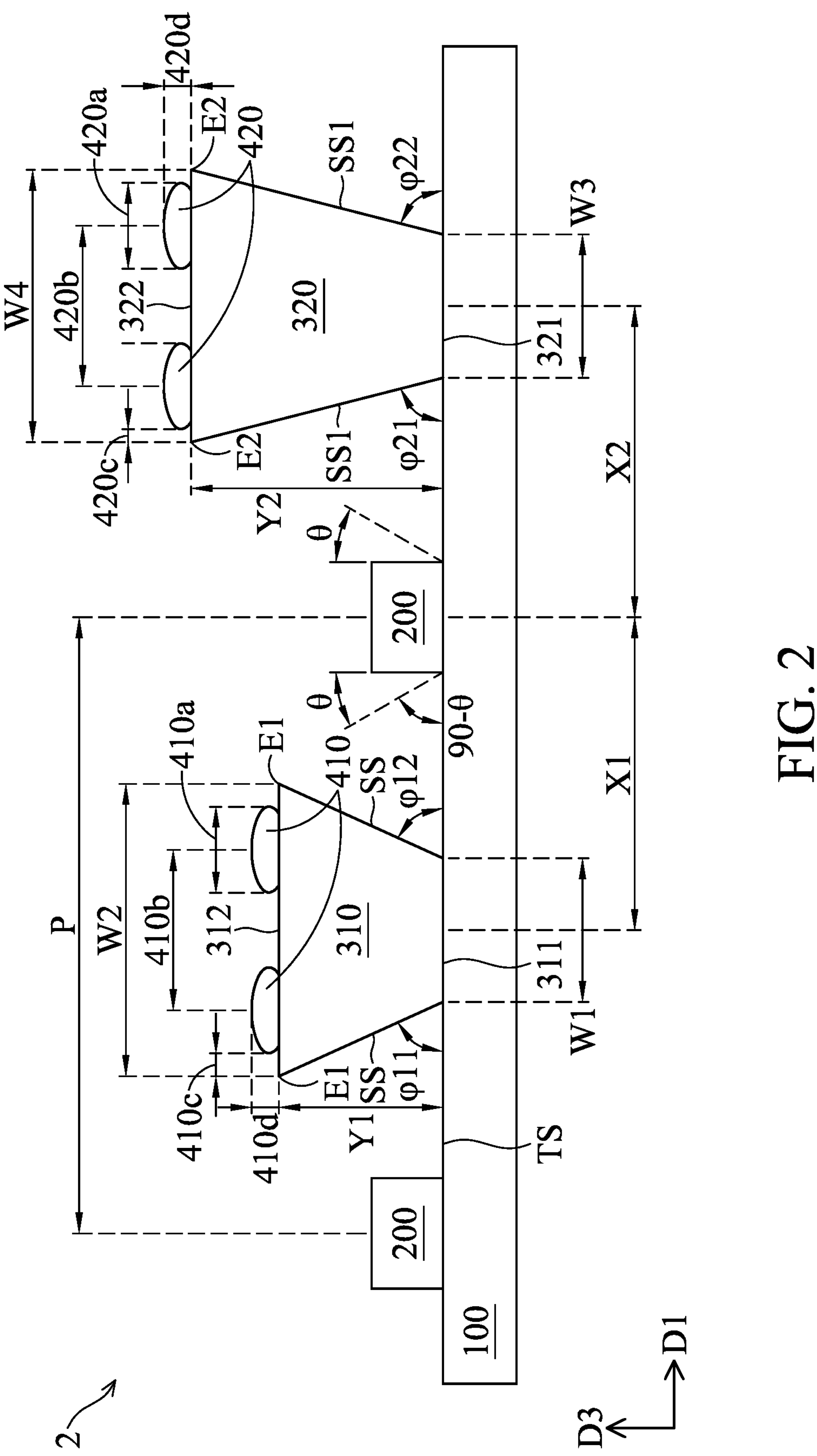
FIG. 2 shows a schematic cross-sectional view taken along A-A' line of the electronic device in FIG. 1, according to some embodiments of the present disclosure.
Figure 3:
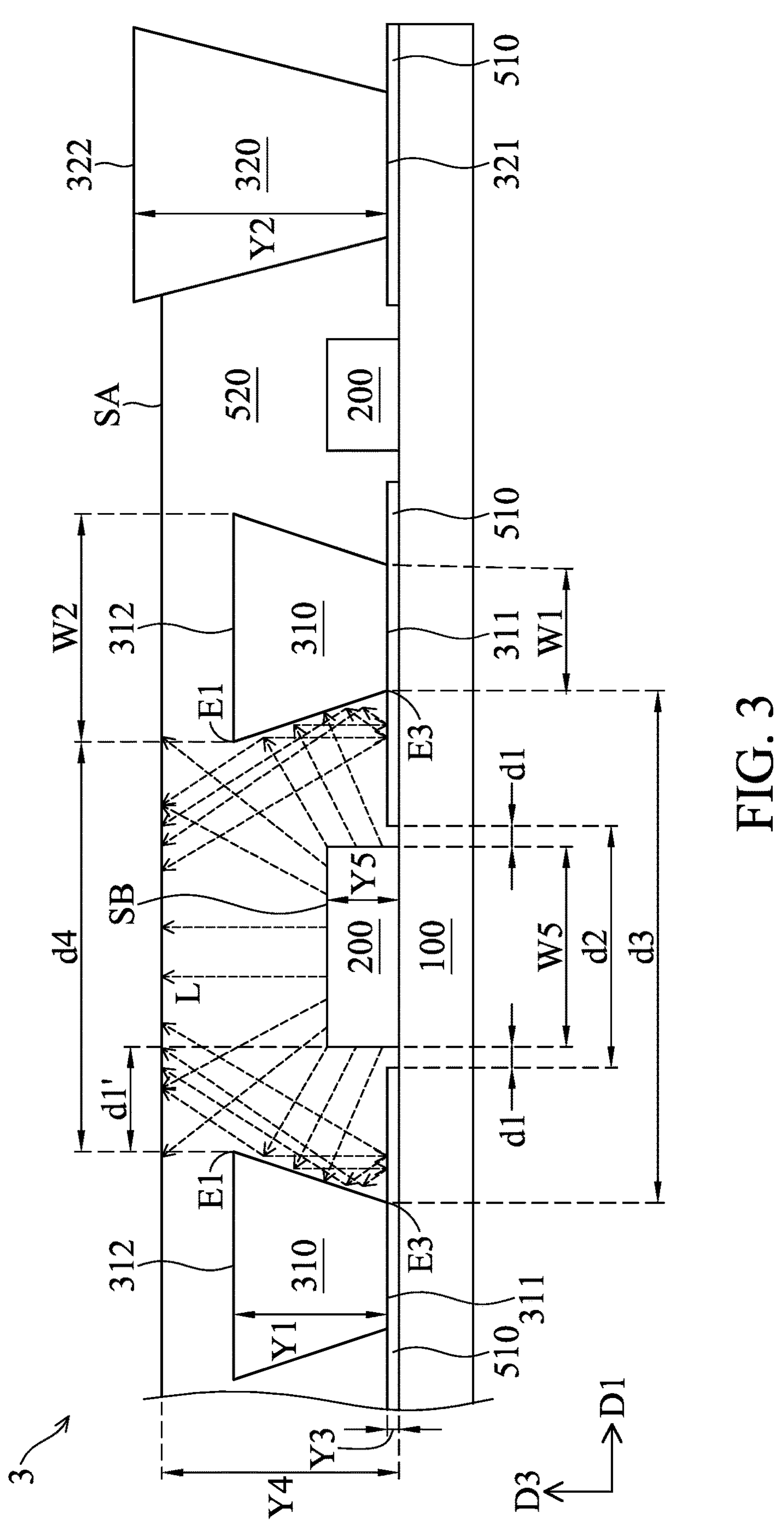
FIG. 3 shows a schematic cross-sectional view taken along B-B' line of the electronic device in FIG. 1, according to some embodiments of the present disclosure.
Figures 4, 5:
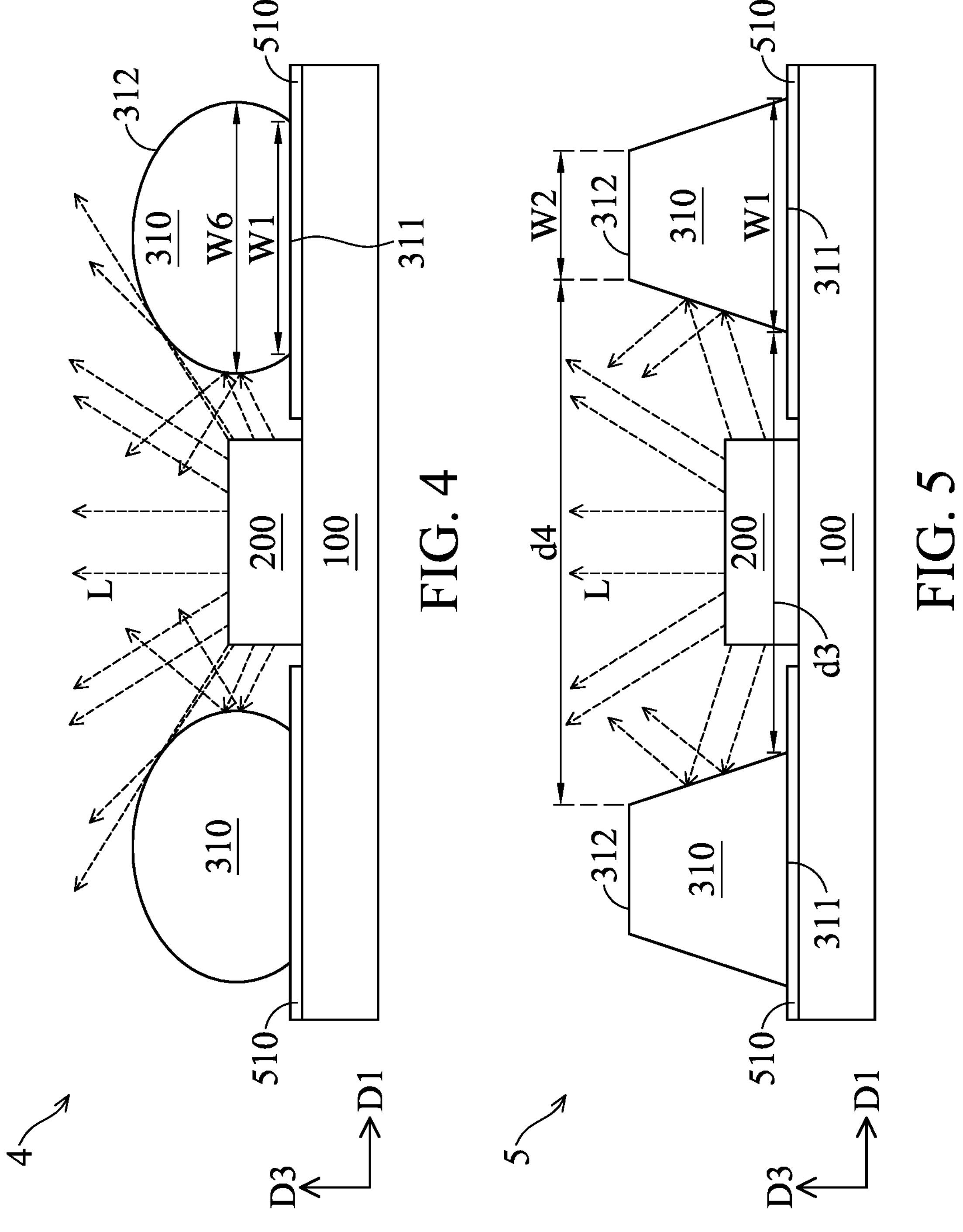
FIG. 4 shows a schematic cross-sectional view taken along C-C' line of the electronic device in FIG. 1, according to some embodiments of the present disclosure.
FIGS. 5 to 8 show schematic cross-sectional views taken along C-C' line of the electronic devices, according to other embodiments of the present disclosure, respectively.

Referring to FIG. 1, it shows a schematic top view of an electronic device 1, according to some embodiments of the present disclosure. FIG. 2 shows a schematic cross-sectional view taken along A-A' line of the electronic device in FIG. 1, according to some embodiments of the present disclosure. FIG. 3 shows a schematic cross-sectional view taken along B-B' line of the electronic device in FIG. 1, according to some embodiments of the present disclosure. FIG. 4 shows a schematic cross-sectional view taken along C-C' line of the electronic device in FIG. 1, according to some embodiments of the present disclosure. It should be understood that, for clarity, some elements of the electronic device 1 are omitted in the drawings, and other elements are schematically shown. In some embodiments, additional elements may be added to the electronic device 1 described below. In other embodiments, some elements of the electronic device 1 described below may be replaced or omitted. Furthermore, the structure of the electronic device will be described below in conjunction with the manufacturing method of the electronic device. It should be understood that, in some embodiments, additional process steps may be provided before, during and/or after the method of manufacturing the electronic device. In some embodiments, some of the described process steps may be replaced or omitted, and the order of some of the described process steps is interchangeable.

As shown in FIG. 1, in some embodiments, the electronic device 1 includes a substrate 100, a plurality of light-emitting elements 200, and a reflective assembly 300 (including a first reflective component 300*a* and a second reflective component 300*b*). In some embodiments, the substrate 100 may include a flexible substrate, a rigid substrate, or a combination thereof, but the present disclosure is not limited thereto. In some embodiments, the substrate 100 may include glass, quartz, sapphire, ceramics, polyimide (PI), polycarbonate (PC), polyethylene terephthalate (PET), polypropylene (PP), other suitable materials, or a combination thereof, but the present disclosure is not limited thereto. In some embodiments, the substrate 100 may include a metal-glass fiber composite plate, or a metal-ceramic composite plate, but the present disclosure is not limited thereto. In some embodiments, the substrate 100 may include a transparent substrate, a semi-transparent substrate, or an opaque substrate. In some embodiments, the substrate 100 may be used as a carrier for carrying light-emitting elements, such as a light board.

In some embodiments, a plurality of light-emitting elements 200 is disposed on the substrate 100. In some embodiments, a plurality of light-emitting elements 200, for example, may be disposed on the substrate 100 in a matrix, but the present disclosure is not limited thereto. The plurality of light-emitting elements 200 may be arranged sequentially along the first direction D1, and the plurality of light-emitting elements 200 may be arranged sequentially along the second direction D2. In some embodiments, the plurality of light-emitting elements 200 may include mini LEDs, micro LEDs, or quantum dot LEDs, but the present disclosure is not limited thereto.

In some embodiments, the reflective assembly 300 is disposed on the substrate 100 and adjacent to the light-emitting elements 200, and the reflective component 300 is used to increase the reflection and/or light-scattering capability of the light-emitting elements 200. Thus, the utilization efficiency of light is increased, the visual effect of light is more uniform, and/or the overall brightness of the electronic device 1 is increased. In some embodiments, the reflective assembly 300 may include a first reflective component 300*a* and/or a second reflective component 300*b*.

In some embodiments, the first reflective component 300*a* is, for example, located on the substrate 100 and located between adjacent two of the plurality of light-emitting elements 200. Specifically, the first reflective component 300*a* may be located between two adjacent light-emitting elements 200. In some embodiments, the first reflective component 300*a* may, for example, have a mesh shape, but the present disclosure is not limited thereto. In some embodiments, the first reflective component 300*a* may include a first reflective structure 310 (referring to FIG. 2). In other words, the first reflective structure 310 may be disposed on the substrate 100 and located between adjacent two of the plurality of light-emitting elements 200. In addition, the first reflective element 300*a* may further include a first reflective microstructure 410 (referring to FIG. 2) and/or a reflective element 510 (referring to FIG. 3).

In some embodiments, the second reflective component 300*b* may be located on the substrate 100 and adjacent to the first reflective component 300*a*. In some embodiments, the second reflective element 300*b* may be disposed adjacent to a side (for example, side S1, side S2, side S3, and/or side S4) of the substrate 100. In some embodiments, the second reflective member 300*b* may have a ring shape.

In some embodiments, the second reflective component 300*b* may, for example, surround the first reflective component 300*a*. In some embodiments, the second reflective component 300*b* may be connected to the first reflective component 300*a* and surround the plurality of light-emitting elements 200. In some embodiments, the second reflective component 300*b* and the first reflective component 300*a* may be, for example, integrally formed. In some embodiments, the disposed light-emitting element 200 closest to the side (for example, side S1, side S2, side S3, and/or side S4) of the substrate 100 may be, for example, disposed between the first reflective structure 310 and a second reflective structure 320 (referring to FIG. 2).

Referring to FIG. 2 or FIG. 3, in some embodiments, the second reflective component 300*b* may include the second reflective structure 320. In addition, the second reflective component 300*b* may further include a second reflective microstructure 420 (referring to FIG. 2) and/or a reflective element 510 (referring to FIG. 3). In some embodiments, the first reflective component 300*a* and/or the second reflective component 300*b* may be used to increase the reflection and/or scattering of the light emitted by the light-emitting device 200, and the second reflective component 300*b* may reduce the light leakage of the light-emitting device 200.

Referring to FIG. 2, it shows a schematic cross-sectional view taken along A-A' line of the electronic device in FIG. 1, according to some embodiments of the present disclosure. For ease of description, components with the same or similar reference numerals as those described above will not be repeated.

As shown in FIG. 2, the electronic device 2 includes a substrate 100, a plurality of light-emitting elements 200, a first reflective structure 310, and/or a second reflective structure 320. In some embodiments, a plurality of light-emitting elements 200 are disposed on the substrate 100 and arranged along the first direction D1. In some embodiments, the first reflective structure 310 may be disposed on the substrate 100 and located between adjacent two of the plurality of light-emitting elements 200.

As shown in FIG. 2, in some embodiments, two adjacent light-emitting elements 200 of the plurality of light-emitting elements 200 may have a pitch P. In some embodiments, when viewed in a cross-sectional view, the pitch P may be the distance between the centerlines of two adjacent light-emitting elements 200 in the first direction D1. In the present disclosure, the centerline of any component, for example, refers to a vertical line extending along the third direction D3 and approximately equally dividing the width of the component along the first direction D1. The centerline of the light-emitting element 200 is, for example, a vertical line extending along the third direction D3 and approximately equally dividing the width of the light-emitting element 200. In some embodiments, in the cross-sectional view, the pitch P may also be the distance between the leftmost boundaries of two adjacent light-emitting elements 200, or the distance between the rightmost boundaries of two adjacent light-emitting elements 200. In some embodiments, half of the pitch P between adjacent two of the plurality of light-emitting elements 200 is the half-pitch X1. In other words, the pitch P and the half-pitch X1 conform to the following relationship: P=2 X1. The half-pitch X1 may also be about the same as the distance from the centerline of the light-emitting element 200 to the centerline of the nearest first reflective structure 310.

As shown in FIG. 2, in some embodiments, the light emitted by one of adjacent two of the plurality of light-emitting elements 200 has an emitting angle, and half of the emitting angle is a half-angle θ. In some embodiments, the half-angle θ may be approximately the angle between the maximum-angled light emitted by the light-emitting element 200 and the normal direction (for example, the third direction D3) of the light-emitting element 200. Specifically, the half-angle θ may be approximately the angle between a single boundary of the light-emitting range (as shown by the dotted line) of the light-emitting device 200 and the normal direction of the light-emitting device 200 (for example, the third direction D3). In some embodiments, according to the light-emitting property of the light-emitting element 200, the half-angle θ may be about 65 degrees to about 88 degrees, but the present disclosure is not limited thereto. For example, the half-angle θ may be about 68 degrees, 70 degrees, 72.5 degrees, 75 degrees, 77.5 degrees, 80 degrees, 82.5 degrees, 85 degrees, 87 degrees, or any combination of the aforementioned values. In some embodiments, the value of the included angle between the maximum angle of light emitted by the light-emitting element 200 and the first direction D1 is 90−θ.

As shown in FIG. 2, in some embodiments, the first reflective structure 310 may have a first thickness Y1 in the third direction D3. In some embodiments, the half-pitch X1, the half-angle θ, and the first thickness Y1 conform to the following relationship:

$$X1 \times 0.5 \times \tan(90-\theta) \leq Y1 \leq X1 \times 1.8 \times \tan(90-\theta).$$

In some embodiments, if the first thickness Y1 is designed to be smaller than X1×0.5×tan(90−θ), the first thickness Y1 of the first reflective structure 310 may be too small to effectively reflect the light emitted from the light-emitting element 200. In some embodiments, if the first thickness Y1 is designed to be greater than X1×1.8×tan(90−θ), the first thickness Y1 of the first reflective structure 310 is too large, which may cause obvious dark streaks around the light-emitting element 200.

As shown in FIG. 2, in some embodiments, a peripheral pitch X2 may be approximately the distance from the centerline of the light-emitting element 200 to the centerline of the nearest second reflective structure 320. In some embodiments, the peripheral pitch X2 may be approximately the distance between the second reflective structure 320 and one of the plurality of light-emitting elements. In some embodiments, the second reflective structure 320 has a second thickness Y2 in the third direction D3. In some embodiments, the peripheral pitch X2, the half-angle θ, and the second thickness Y2 conform to the following relationship:

$$X2 \times 1.8 \times \tan(90-\theta) \leq Y2 \leq X2 \times 2.5 \times \tan(90-\theta).$$

In some embodiments, if the second thickness Y2 is designed to be smaller than X2×1.8×tan(90−θ), the second thickness Y2 of the second reflective structure 320 is too small, which may cause the light emitted from the light-emitting element 200 to leak. As a result, defects such as bright streaks (for example, striped bright streaks) and/or uneven brightness (mura) may occur. In some embodiments, if the second thickness Y2 is designed to be greater than X2×2.5×tan(90−θ), the second thickness Y2 of the second reflective structure 320 is too large, which may cause problems. For example, that the thickness of the electronic device 2 may be too thick and/or the cost of manufacturing may be increased.

In some embodiments, the first thickness Y1of the first reflective structure 310 and the second thickness Y2 of the second reflective structure 320 may be greater than the fifth thickness Y5 (referring to FIG. 3) of the light-emitting element 200 in the third direction D3. In some embodiments, the second thickness Y2 of the second reflective structure 320 may differ from the first thickness Y1 of the first reflective structure 310. In some embodiments, the second thickness Y2 of the second reflective structure 320 may be greater than or equal to the first thickness Y1of the first reflective structure 310.

In some embodiments, the half-pitch X1and the peripheral pitch X2 conform to the following relationship:

$$X1 \times 0.8 \leq X2 \leq X1 \times 1.2.$$

By adjusting the relationship between the half-pitch X1 and the peripheral pitch X2 in the aforementioned design, defects such as bright streaks (for example, striped bright streaks) and uneven brightness may be reduced.

As shown in FIG. 2, in some embodiments, the first reflective structure 310 may have a first surface (i.e., the first bottom surface 311) and a second surface (i.e., the first top surface 312). The first surface (i.e., the first bottom surface 311) of the first reflective structure 310 is adjacent to the substrate 100, and the second surface (i.e., the first top surface 312) of the first reflective structure 310 is away from the substrate 100. In some embodiments, when viewed in a cross-sectional view, the first surface (i.e., the first bottom surface 311) may have a first width W1 in the first direction D1, and the second surface (i.e., the first top surface 312) may have a second width W2 in the first direction D1. In some embodiments, when viewed in a cross-sectional view, the first width W1 may be smaller than the second width W2, but the present disclosure is not limited thereto. In some embodiments, the projection of the first surface (i.e., the first bottom surface 311) of the first reflective structure 310 on the substrate 100 is located within the projection of the second surface (i.e., the first top surface 312) of the first reflective structure 310 on the substrate 100. In other words, when viewed in a cross-sectional view, the cross-sectional shape of the first reflective structure 310 is, for example, an inverted trapezoid, but the present disclosure is not limited thereto.

In some embodiments, when viewed in a cross-sectional view, there may be a first angle φ11 between the side surface SS of the first reflective structure 310 and the top surface TS (for example, a plane perpendicular to the third direction D3) of the substrate 100, and there may be a first angle φ12 between the other side surface SS of the first reflective structure 310 and the top surface TS of the substrate 100. In some embodiments, the values of the first angle φ11 and the first angle φ12 may be the same or different. In some embodiments, the difference between the first angle φ11 and the first angle φ12 may be between 0 degrees and 45 degrees, but the present disclosure is not limited thereto. In some embodiments, the difference between the first angle φ11 and the first angle φ12 may be between 0 degrees and 30 degrees, but the present disclosure is not limited thereto. In some embodiments, the first angle φ11 and/or the first angle φ12 may be greater than or equal to 60 degrees and less than or equal to 120 degrees, but the present disclosure is not limited thereto. In some embodiments, the first angle φ11 and/or the first angle φ12 may be greater than or equal to 50 degrees and less than or equal to 110 degrees, but the present disclosure is not limited thereto. In some embodiments, the first angle φ11 and/or the first angle φ12 may be greater than or equal to 60 degrees and less than or equal to 100 degrees, but the present disclosure is not limited thereto. In some embodiments, the second width W2 conforms to the following relationship: 0.5 millimeters (mm)≤W2≤1.5 mm. In some embodiments, the second width W2 conforms the following relationship: 0.45 mm≤W2≤1.45 mm. In some embodiments, the second width W2 conforms the following relationship: 0.5 mm≤W2≤1.4 mm.

As shown in FIG. 2, in some embodiments, the second reflective structure 320 may have a second bottom surface 321 and a second top surface 322. In some embodiments, the second bottom surface 321 may have a third width W3 in the first direction D1, and the second top surface 322 may have a fourth width W4 in the first direction D1. In some embodiments, when viewed in a cross-sectional view, the third width W3 may be smaller than the fourth width W4. For example, the projection of the second bottom surface 321 of the second reflective structure 320 on the substrate 100 is located within the projection of the second top surface 322 of the second reflective structure 320 on the substrate 100. In other words, when viewed in a cross-sectional view, the cross-sectional shape of the second reflective structure 320 is, for example, an inverted trapezoid, but the present disclosure is not limited thereto.

In some embodiments, when viewed in a cross-sectional view, there may be a second angle φ21 between the side surface SS1 of the second reflective structure 320 and the top surface TS (for example, a plane perpendicular to the third direction D3) of the substrate 100, and there may be a second angle φ22 between the other side surface SS1 of the second reflective structure 320 and the top surface TS (for example, a plane perpendicular to the third direction D3) of the substrate 100. In some embodiments, the value of the second angle φ21 and/or the second angle φ22 of the second reflective structure 320 and the value of the first angle φ11 and/or the first angle φ12 of the first reflective structure 310 may be same or different. In some embodiments, the values of the second angle φ21 and the second angle φ22 may be the same or different. In some embodiments, the difference between the second angle φ21 and the second angle φ22 may be between 0 degrees and 45 degrees, but the present disclosure is not limited thereto. In some embodiments, the difference between the second angle φ21 and the second angle φ22 may be between 0 degrees and 30 degrees, but the present disclosure is not limited thereto. In some embodiments, the second angle φ21 and the second angle φ22 may be greater than or equal to 60 degrees and less than or equal to 120 degrees. In some embodiments, the second angle φ21 and the second angle φ22 may be greater than or equal to 50 degrees and less than or equal to 110 degrees, but the present disclosure is not limited thereto. In some embodiments, the second angle φ21 and the second angle φ22 may be greater than or equal to 60 degrees and less than or equal to 100 degrees, but the present disclosure is not limited thereto.

In some embodiments, the fourth width W4 conforms to the following relationship: 0.5 mm≤W4≤1.5 mm. In some embodiments, the fourth width W4 conforms to the following relationship: 0.45 mm≤W4≤1.45 mm. In some embodiments, the fourth width W4 conforms to the following relationship: 0.5 mm≤W4≤1.4 mm. In some embodiments, the second width W2 may, for example, be the same as or different from the fourth width W4. In some embodiments, the first width W1 may, for example, be the same as or different from the third width W3.

In some embodiments, the first reflective structure 310 and/or the second reflective structure 320 may include a reflective material. The aforementioned reflective material may include metal, metal oxide, white reflective material (such as white paint or other white material), photoresist material, the like or a combination thereof, but the present disclosure is not limited thereto. In some embodiments, the reflective material of the first reflective structure 310 and/or the second reflective structure 320 may have a reflectivity greater than or equal to 90% at the wavelength of visible light. The reflectivity of the aforementioned reflective material at the wavelength of visible light may be greater than 90%, 95%, 99%, 99.9%, 99.99%, or any value or value range between the aforementioned values, but the present disclosure is not limited thereto. When the first reflective structure 310 and/or the second reflective structure 320 have high reflectivity, they may reflect the light emitted by the light-emitting element. In some embodiments, the first reflective structure 310 and/or the second reflective structure 320 may be formed by a patterning process described later. For example, the material of the first reflective structure 310 and/or the second reflective structure 320 may include photoresist.

As shown in FIG. 2, in some embodiments, the first reflective microstructure 410 may be disposed on the first reflective structure 310. In some embodiments, the second reflective microstructure 420 may be disposed on the second reflective structure 320. In some embodiments, the first reflective microstructure 410 and the second reflective microstructure 420 may be formed of the same or different materials. In some embodiments, the first reflective microstructure 410 or the second reflective microstructure 420 may be disposed in the electronic device 2 by the same process or different processes. The first reflective microstructure 410 and/or the second reflective microstructure 420 may help to increase the ratio of the light emitted by the light-emitting element 200 guided to the normal direction (the third direction D3) of the substrate 100, and may increase the utilization efficiency of light emitted by the light-emitting element 200.

In some embodiments, a plurality of first reflective microstructures 410 may be disposed on the first top surface 312 of the first reflective structure 310. In some embodiments, the plurality of first reflective microstructures 410 may be disposed on the first top surface 312, for example, in a matrix or another regular manner. In other embodiments, the plurality of first reflective microstructures 410 may be disposed on the first top surface 312, for example, in another irregular way. In some embodiments, the plurality of first reflective microstructures 410 may be disposed on a portion of the second surface (i.e. the first top surface 312) of the first reflective structure 310, so the first reflective microstructure 410 may not be disposed on another portion of the first top surface 312. In some embodiments, a plurality of second reflective microstructures 420 may be disposed on the second top surface 322 of the second reflective structure 320. In some embodiments, the plurality of second reflective microstructures 420 may be disposed on the second top surface 322, for example, in a matrix or another regular manner. In other embodiments, the plurality of second reflective microstructures 420 may be disposed on the second top surface 322, for example, in another irregular way. In some embodiments, the plurality of second reflective microstructures 420 may be disposed on a portion of the second top surface 322 of the second reflective structure 320, so the second reflective microstructure 420 may not be disposed on another portion of the second top surface 322.

In some embodiments, the plurality of first reflective microstructures 410 may be arranged along the first direction D1 and respectively have a first microstructure width 410*a*, but the present disclosure is not limited thereto. The plurality of second reflective microstructures 420 may be arranged along the first direction D1 and respectively have a second microstructure width 420*a*, but the present disclosure is not limited thereto. In some embodiments, the first microstructure width 410*a* and/or the second microstructure width 420*a* may be greater than or equal to 0.1 mm or greater than 0.08 mm and less than the second width W2 of the first top surface 312 of the first reflective structure 310, but the present disclosure is not limited thereto. In some embodiments, the second microstructure width 420*a* may be greater than or equal to 0.1 mm or greater than 0.08 mm and less than the fourth width W4 of the second top surface 322 of the second reflective structure 320, but the present disclosure is not limited thereto. In some embodiments, along the first direction D1, the distance between the centerlines of two adjacent first reflective microstructures 410 is a first microstructure pitch 410*b*. Along the first direction D1, the distance between the centerlines of two adjacent second reflective microstructures 420 is a second microstructure pitch 420*b*. In some embodiments, the first microstructure pitch 410*b* and/or the second microstructure pitch 420*b* may be greater than or equal to 0.2 mm or 0.18 mm, but the present disclosure is not limited thereto.

In some embodiments, along the first direction D1, the distance between the first reflective microstructure 410 and a boundary E1 of the first top surface 312 of the first reflective structure 310 is a pitch 410*c*. In other words, the pitch 410*c* is, for example, the minimum distance between the first reflective microstructure 410 closest to the boundary E1 of the first top surface 312 and the boundary E1. Along the first direction D1, the distance between the second reflective microstructure 420 and a boundary E2 of the second top surface 322 of the second reflective structure 320 is a pitch 420*c*. In other words, the pitch 420*c* is, for example, the minimum distance between the second reflective microstructure 420 closest to the boundary E2 of the second top surface 322 and the boundary E2. In some embodiments, the pitch 410*c* is greater than or equal to 0.1 mm or 0.08 mm and less than half of the second width W2 of the first top surface 312, but the present disclosure is not limited thereto. In some embodiments, the pitch 420*c* is greater than or equal to 0.1 mm or 0.08 mm and less than half of the fourth width W4 of the second top surface 322, but the present disclosure is not limited thereto.

In some embodiments, along the third direction D3, the first reflective microstructure 410 may have a first microstructure thickness 410*d*. Along the third direction D3, the second reflective microstructure 420 may have a second microstructure thickness 420*d*. In some embodiments, the first microstructure thickness 410*d* and/or the second microstructure thickness 420*d* may be greater than 0 and less than or equal to 0.05 mm (or less than or equal to 0.04 mm).

In some embodiments, the first reflective microstructure 410 and/or the second reflective microstructure 420 may include reflective materials, such as metals, metal oxides, white reflective materials (such as white paint or other white materials), photoresist material, the like or a combination thereof, but the present disclosure is not limited thereto. In some embodiments, the material of the first reflective microstructure 410 and/or the second reflective microstructure 420 and the material of the first reflective structure 310 and/or the second reflective structure 320 may be the same or different.

In some embodiments, the reflectivity of the material of the first reflective microstructure 410 and/or the second reflective microstructure 420 at the wavelength of visible light is greater than or equal to 85%. For example, the reflectivity at the wavelength of visible light is greater than 85%, 87.5%, 90%, 92.5%, 95%, 99%, or any value or value range between the aforementioned values, but the present disclosure is not limited thereto. In some embodiments, the first reflective structure 310 and/or the second reflective structure 320 may be formed by a photolithography process that will be described later. In some embodiments, the first reflective microstructure 410 and/or the second reflective microstructure 420 may be formed by a photolithography process that will be described later. For example, the material of the first reflective structure 310, the second reflective structure 320, the first reflective structure 310 and/or the second reflective structure 320 includes photoresist, but the present disclosure is not limited thereto.

Referring to FIG. 3, it shows a schematic cross-sectional view taken along B-B' line of the electronic device in FIG. 1, according to some embodiments of the present disclosure. For ease of description, components with the same or similar reference numerals as those described above will not be repeated.

As shown in FIG. 3, in some embodiments, the electronic device 3 further includes a reflective element 510. In some embodiments, along the third direction D3, the reflective element 510 may be disposed between the substrate 100 and the first reflective structure 310. Along the third direction D3, the reflective element 510 may be disposed between the substrate 100 and the second reflective structure 320. Along the first direction D1 (or other directions perpendicular to the third direction D3), the reflective element 510 may be disposed between adjacent two of the plurality of light-emitting elements 200. In other words, the reflective element 510 may be disposed between adjacent two of the plurality of light-emitting elements 200. In some embodiments, the reflective element 510 may have a third thickness Y3 in the third direction D3. The third thickness Y3 may be greater than or equal to 20 micrometers (um) and less than or equal to 70 um, but the present disclosure is not limited thereto. In some embodiments, the third thickness Y3 may be greater than or equal to 30 um and less than or equal to 60 um. In some embodiments, the third thickness Y3 may be greater than or equal to 35 um and less than or equal to 55 um. In some embodiments, the reflective element 510 may improve the overall brightness of the electronic device 3.

As shown in FIG. 3, in some embodiments, the light-emitting element 200 may have a light-emitting element width W5 in the first direction D1. In some embodiments, the plurality of light-emitting elements 200 are arranged in the first direction D1, and in the first direction D1, the minimum distance d1 between one reflective element 510 and one of the plurality of light-emitting elements 200 is, for example, smaller than the minimum distance d1' between the reflective structure 310 and the one of the plurality of light-emitting elements 200. In other words, in the first direction D1, there is one light-emitting element 200 between two adjacent reflective elements 510, and there is the aforementioned minimum distance d1 between any one of the two reflective elements 510 and the light-emitting element 200. In addition, the aforementioned minimum distance d1' is, for example, the minimum distance between the light-emitting element 200 and the first reflective structure 310 in the first direction D1 viewed in the normal direction (for example, the third direction D3) of the substrate 100. In other words, the projection of the first reflective structure 310 onto the substrate 100 may define a first projection area (not shown), and the projection of the light-emitting element 200 onto the substrate 100 may define a second projection area (not shown). The minimum distance d1' is, for example, the minimum distance between the first projection area (not shown) and the second projection area (not shown) in the first direction D1. In some embodiments, in the first direction D1, there is a minimum distance d2 between two adjacent reflective elements 510. In some embodiments, the light-emitting element width W5, the minimum distance d1, and the minimum distance d2 conform to the following relationship:

$$d2 = W5 + 2 \times d1.$$

It should be noted that the minimum distance d1 may be adjusted according to the process of formation of the reflective element 510. For example, the minimum distance d1 may be greater than or equal to 0.01 mm and less than or equal to 0.05 mm, but the present disclosure is not limited thereto. Alternatively, the minimum distance d1 may be greater than or equal to 0.015 mm and less than or equal to 0.045 mm. Alternatively, the minimum distance d1 may be greater than or equal to 0.02 mm and less than or equal to 0.04 mm.

As shown in FIG. 3, in some embodiments, the first reflective structure 310 has a first surface (i.e., the first bottom surface 311) adjacent to the substrate 100 and a second surface (i.e., the first top surface 312) away from the substrate 100, and the first width W1 of the first surface (i.e., the first bottom surface 311) of the first reflective structure 310 is smaller than the second width W2 of the second surface (i.e., the first top surface 312) of the first reflective structure 310. In some embodiments, along the first direction D1, the distance between the boundaries E3 of the first surfaces (for example, the first bottom surface 311) of two adjacent first reflective structures 310 is a distance d3. In some embodiments, along the first direction D1, the distance between the boundaries E1 of the second surfaces (for example, first top surfaces 312) of two adjacent first reflective structures 310 is a distance d4. As described above, when the first width W1 is smaller than the second width W2, the distance d3 may be greater than the distance d4, but the present disclosure is not limited thereto. In the present embodiment (FIG. 3), in the first direction D1, the distance d3 may be approximately the maximum distance between two adjacent first reflective structures 310, and the distance d4 may be approximately the minimum distance between two adjacent first reflective structures 310, but the present disclosure is not limited thereto.

In some other embodiments (for example, the following FIG. 5), the first width W1 of the first surface (i.e., the first bottom surface 311) of the first reflective structure 310 may be larger than the second width W2 of the second surface (i.e., the first top surface 312) of the first reflective structure 310, so the distance d3 may be smaller than the distance d4. In this embodiment, when viewed in a cross-sectional view, the distance d3 may be approximately the minimum distance between two adjacent first reflective structures 310, and the distance d4 may be approximately the maximum distance between two adjacent first reflective structures 310, but the present disclosure is not limited thereto.

As shown in FIG. 3, in some embodiments, in the first direction D1, the minimum distance d1 between the reflective element 510 and one of the plurality of light-emitting elements 200 is, for example, smaller than the minimum distance d1' between the first reflective structure 310 and the one of the plurality of light-emitting elements 200. In some embodiments, the minimum distance d2 between the aforementioned two adjacent reflective elements 510 may be less than or equal to the aforementioned distance d3. In some embodiments, the aforementioned minimum distance d2 may be less than or equal to the distance d4 and/or the distance d3.

In some embodiments, in the electronic device 3, the material of the reflective element 510 may be the same or different from the material of the first reflective structure 310 and/or the second reflective structure 320. The material of the reflective element 510 may include metal, metal oxide, white reflective material (such as white paint or other white material), photoresist material, the like or a combination thereof, but the present disclosure is not limited thereto. In some embodiments, the material of the reflective element 510 may have a reflectivity of greater than 85% (for example, between 85% and 92%) at the wavelength of visible light, and the reflective element 510 has the ability to reflect light for reuse or guide light to the third direction D3.

As shown in FIG. 3, in some embodiments, the electronic device 3 may further include a protective structure 520. In some embodiments, the protective structure 520 may be disposed on the light-emitting device 200 to protect the light-emitting device 200. In some embodiments, the protective structure 520 may include a single layer or multiple layers of material. According to different types of light-emitting elements 200, the protective structure 520 may be provided or omitted accordingly. In some embodiments, the protective structure 520 may be a protective adhesive. Specifically, the protective structure 520 may include silicone, acrylic, urethane, epoxy, acrylic hydrogel, the like or a combination thereof, but the present disclosure is not limited thereto.

In some embodiments, the protective structure 520 may have a fourth thickness Y4 in the third direction D3. In some embodiments, the fourth thickness Y4 may be greater than or equal to the fifth thickness Y5 of the light-emitting element 200 in the third direction D3. In some embodiments, the fourth thickness Y4 may, for example, be greater than the sum of the third thickness Y3 and the first thickness Y1, but the present disclosure is not limited thereto. In other embodiments (not shown), the fourth thickness Y4 may, for example, be less than or equal to the sum of the third thickness Y3 and the first thickness Y1, but the present disclosure is not limited thereto. In some embodiments, the fourth thickness Y4 may be less than or equal to the sum of the third thickness Y3 and the second thickness Y2 . In some embodiments, the top surface SA of the protective structure 520 may be higher than the top surface SB of the light-emitting element 200. In some embodiments, the protective structure 520 may cover the light-emitting element 200 and the first top surface 312 of the first reflective structure 310, but the protective structure 520 may expose the second top surface 322 of the second reflective structure 320. In some embodiments (not shown), the protective structure 520 may cover the second top surface 322 of the second reflective structure 320.

As shown in FIG. 3, in some embodiments, the cross-sectional shape of the first reflective structure 310 and/or the second reflective structure 320 may be adjusted according to requirements. In some embodiments, the cross-sectional shape of the first reflective structure 310 and/or the second reflective structure 320 is a rectangle, a regular trapezoid, an inverted trapezoid, a shape with a curved edge, the like or a combination thereof, but the present disclosure is not limited thereto. In some embodiments, the cross-sectional shapes of the first reflective structure 310 and the second reflective structure 320 may be the same or different.

FIG. 4 shows a schematic cross-sectional view taken along C-C' line of the electronic device in FIG. 1, according to some embodiments of the present disclosure. FIGS. 5 to 8 show schematic cross-sectional views taken along C-C' line of the electronic devices, according to other embodiments of the present disclosure, respectively.

Referring to FIG. 3 together with FIG. 4 to FIG. 8, the cross-sectional shape of the first reflective structure 310 and/or the second reflective structure 320 is further described. It should be noted that, regardless of the cross-sectional shape of the first reflective structure 310 and/or the second reflective structure 320, the first reflective microstructure 410 may be disposed on the first reflective structure 310 or the second reflective microstructure 420 may be disposed on the second reflective structure 320 according to requirements. Thus, the ratio of the light guided to the normal direction (the third direction D3) of the substrate 100 may be increased.

As shown in FIG. 3, the cross-sectional shapes of the first reflective structure 310 and the second reflective structure 320 may be the inverted trapezoid. An inverted trapezoid is, for example, a trapezoid in which the area (or width) of the top surface of an element is greater than the area (or width) of the bottom surface of the element. As shown in FIG. 3, the area (or width) of the first top surface 312 of the first reflective structure 310 may be greater than the area (or width) of the first bottom surface 311 of the first reflective structure 310. As shown in FIG. 3, the area (or width) of the second top surface 322 of the second reflective structure 320 may be greater than the area (or width) of the second bottom surface 321 of the second reflective structure 320. As shown in FIG. 3, the light-emitting element 200 may emit light L, and the light L is reflected by the first reflective structure 310 and/or the reflective element 510, so as to increase the utilization efficiency of the light L and make the visual effect of the light L more uniform and/or increase the overall brightness of the electronic device 3. In FIG. 3, for example, the light L may be reflected by the first reflective structure 310 and concentrated toward the normal direction (the third direction D3) of the substrate 100. It should be noted that the protective structure 520 may not significantly affect the reflection and/or scattering of the light L emitted by the light-emitting element 200.

FIGS. 4 to 8 show schematic cross-sectional views taken along C-C' line of the electronic devices, according to different embodiments of the present disclosure, respectively. For ease of description, components with the same or similar reference numerals as those described above will not be repeated.

As shown in FIG. 4, in some embodiments, the cross-sectional shape of the first reflective structure 310 of the electronic device 4 may be a drop-like shape (a shape with curved edges) or a bullet-liked shape, but the present disclosure is not limited thereto. In some embodiments, in the first direction D1, the first surface (i.e., the first bottom surface 311) of the first reflective structure 310 has the first width W1 and the first reflective structure 310 has a maximum width W6. The maximum width W6 is, for example, the width of the substantially middle portion of the first reflective structure 310. That is, the maximum width W6 is not the width of the first bottom surface 311 or the first top surface 312 (referring to FIG. 3), but the present disclosure is not limited thereto. In some embodiments (FIG. 4), the first width W1 may be smaller than the maximum width W6 and the cross-sectional shape of the first reflective structure 310 may be a drop-like shape. In other embodiments, the first width W1 may be greater than or substantially equal to the maximum width W6 and the cross-sectional shape of the first reflective structure 310 may be a bullet-like shape. In some embodiments, the first top surface 312 of the first reflective structure 310 may be curved. In the present embodiment, since the first top surface 312 is curved, the width of the first reflective structure 310, for example, decreases upward from the maximum width W6, which improves the reflection and/or scattering of light L emitted from the edge of the top surface of the light-emitting element 200. As shown in FIG. 4, the cross-sectional shape of the first reflective structure 310 may be a major arc. Similarly, the shape of the second reflective structure 320 may also have a similar design.

As shown in FIG. 5, in some embodiments, the cross-sectional shape of the first reflective structure 310 of the electronic device 5 is a regular trapezoid. The regular trapezoid is a trapezoid whose top surface area is smaller than the bottom surface area. As shown in FIG. 5, the area (or width) of the first top surface 312 of the first reflective structure 310 may be smaller than the area (or width) of the first bottom surface 311 of the first reflective structure 310. Similarly, the shape of the second reflective structure 320 may also have a similar design.

Figure 6:
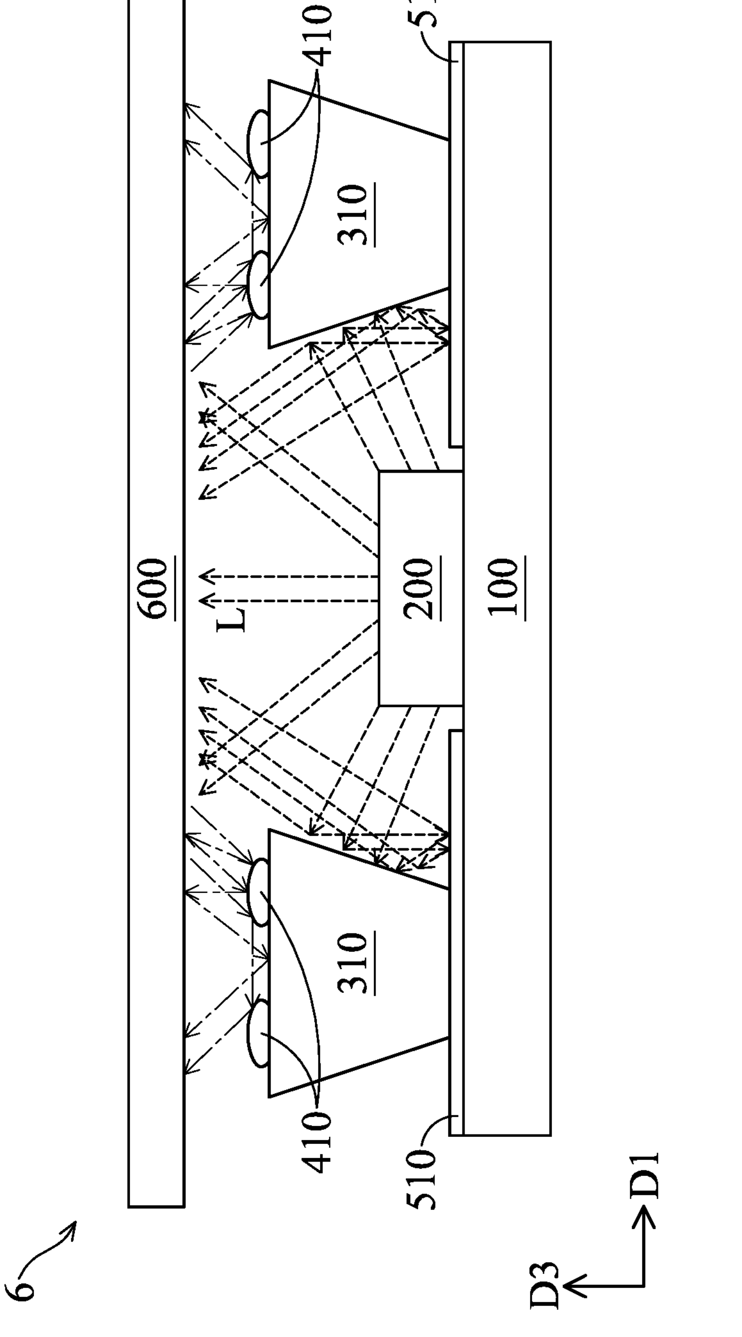

As shown in FIG. 6, in some embodiments, the cross-sectional shape of the first reflective structure 310 of the electronic device 6 is an inverted trapezoid. In some embodiments, electronic device 6 may include an optical film 600. In some embodiments, the optical film 600 may be disposed on the substrate 100, and the light-emitting element 200 may be located between the optical film 600 and the substrate 100. In some embodiments (not shown), the optical film 600 may be, for example, in contact with the second reflective structure 320 or the second reflective microstructure 420. In some embodiments (not shown), for example, an additional functional layer (not shown) may be disposed between the optical film 600 and the second reflective structure 320. As shown in FIG. 6, the optical path of the light L emitted by the light-emitting element 200 shows that the first reflective structure 310 or the reflective element 510 may increase the utilization efficiency of the light. The first reflective microstructure 410 may increase the ratio of the light guided to the third direction D3.

In some embodiments, referring to FIG. 2 and FIG. 6, most of the light emitted by the light-emitting element 200 may be reflected by the first reflective structure 310 and/or the second reflective structure 320. The first reflective microstructure 410 and/or the second reflective microstructure 420 may be used, for example, to assist in reflecting the light reflected back through the optical film 600, and may further guide the light to the third direction D3 (for example, a normal viewing angle), or improve the leakage of the light. In some embodiments, the reflectivity of the first reflective structure 310 and/or the second reflective structure 320 at the wavelength of visible light may be higher than that of the first reflective microstructure 410 and/or the second reflective microstructure 420 at the wavelength of visible light. For example, the reflectivity of the first reflective structure 310 and/or the second reflective structure 320 may be higher than the reflectivity of the microstructure 410 and/or the second reflective microstructure 420 by 2.5%, 5%, 7.5%, or any value or value range between the aforementioned values, but the present disclosure is not limited thereto. In other embodiments, the reflectivity of the first reflective structure 310 and/or the second reflective structure 320 may be the same as that of the first reflective microstructure 410 and/or the second reflective microstructure 420.

Figure 7:
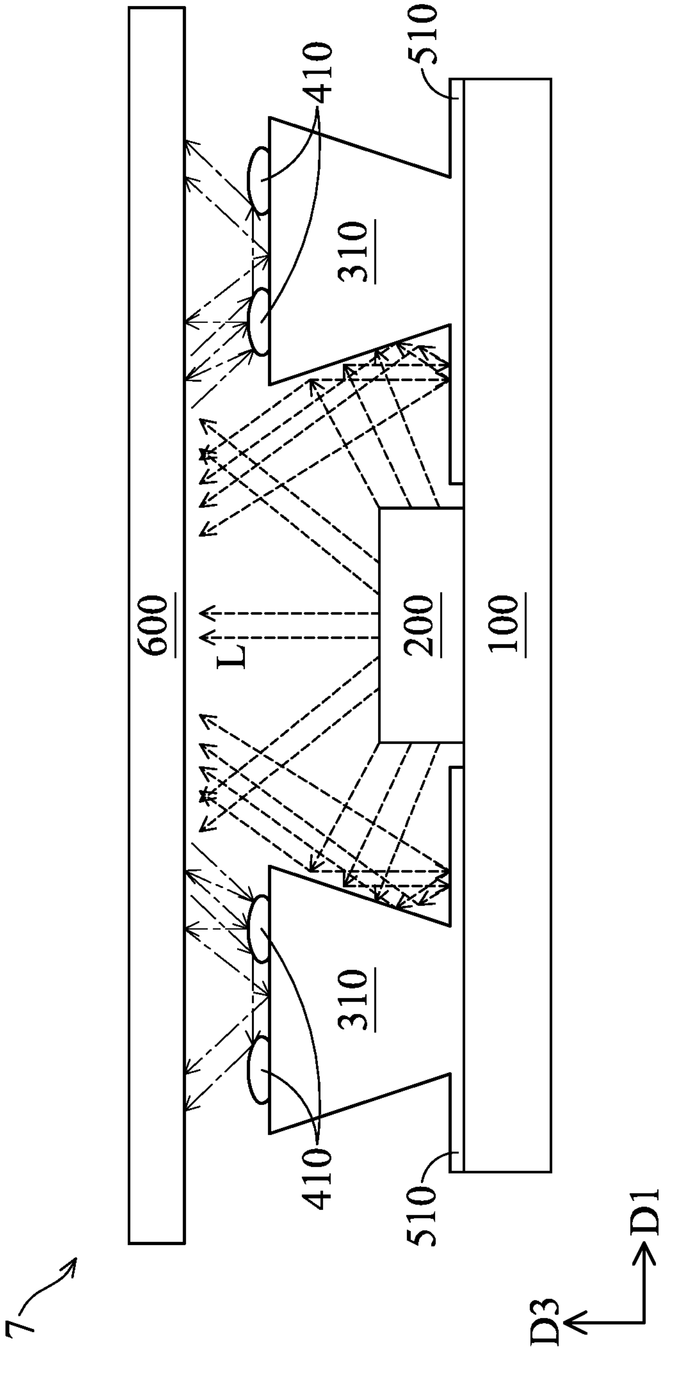

As shown in FIG. 7, in some embodiments, the reflective element 510 and the first reflective structure 310 of the electronic device 7 may be, for example, integrally formed. The reflective element 510 and the first reflective structure 310 are formed of the same material, but the present disclosure is not limited thereto. Therefore, there may be substantially no interface between the reflective element 510 and the first reflective structure 310. In some embodiments, the reflective element 510 and the first reflective structure 310 may be integrated into a gentleman's hat shape, but the present disclosure is not limited thereto.

Figure 8:
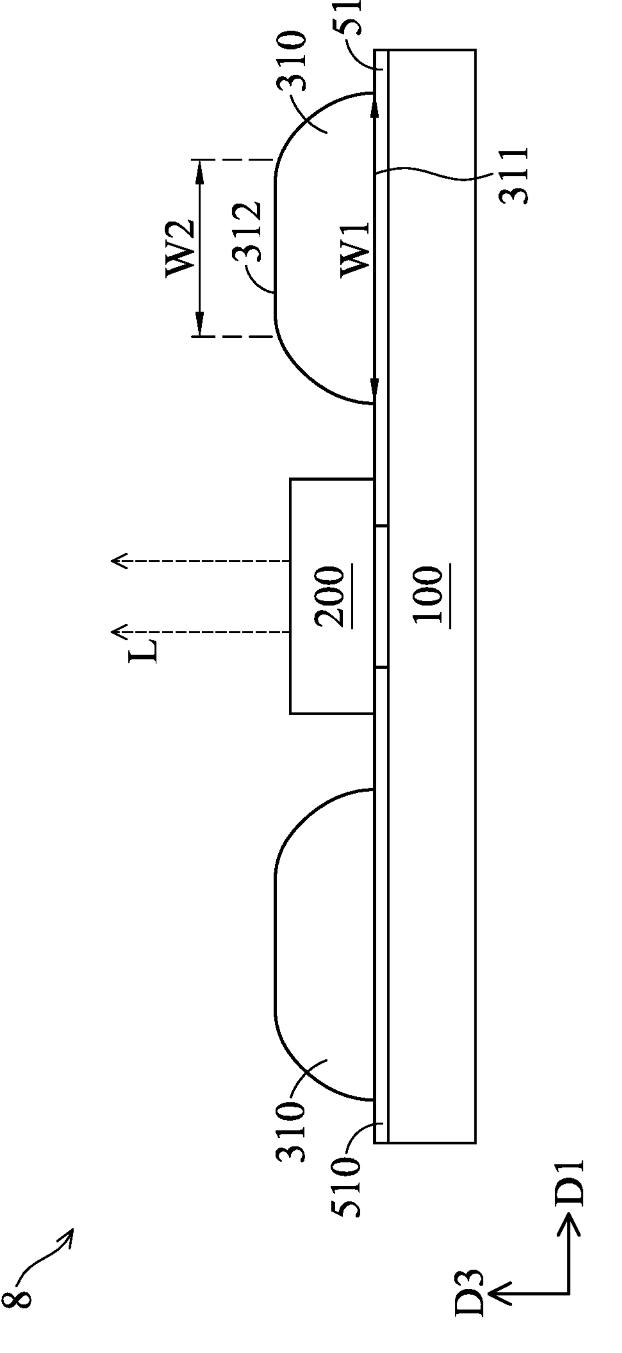

As shown in FIG. 8, in some embodiments, the cross-sectional shape of the first reflective structure 310 of the electronic device 8 is also another drop-like shape. The first top surface 312 of the first reflective structure 310 may be substantially a flat surface. In some embodiments, along the first direction D1, the first width W1 of the first surface (i.e., the first bottom surface 311) of the first reflective structure 310 may be greater than the second width W2 of the second surface (i.e., the first top surface 312) of the first reflective structure 310. In some embodiments, the first width W1 and the second width W2 conform to the following relationship:

$$0.5\text{ mm} \leq W1 \leq 2.5\text{ mm; and}$$

$$0.3\text{ mm} \leq W2 \leq 1.5\text{ mm.}$$

Since the first top surface 312 of the first reflective structure 310 may further include a flat surface, it may be beneficial to dispose the first reflective microstructure 410 on the first reflective structure 310. When the first width W1 and/or the second width W2 are too large, it may cause dark shadows in the visual effect, and when the first width W1 and/or the second width W2 are too small, it may cause the lights emitted by the adjacent light-emitting elements interfere with each other.

It should be noted that, regardless of the cross-sectional shape of the first reflective structure 310, compared with the electronic device without the first reflective structure 310, the electronic device provided with the first reflective structure 310 may improve utilization efficiency of the light.

As shown in FIG. 8, in some embodiments, the reflective element 510 may be disposed between the substrate 100 and the light-emitting element 200. In some embodiments, the reflective element 510 may partially overlap the light-emitting element 200 in the normal direction (the third direction D3) of the substrate 100. In other words, a portion of the reflective element 510 may be disposed between the first reflective structure 310 and the substrate 100, and another portion of the reflective element 510 may be disposed between the light-emitting element 200 and the substrate 100. In some embodiments, whether a portion of the reflective element 510 extends between the substrate 100 and the light-emitting element 200 is controlled according to the soldering and/or bonding process of the light-emitting element 200.

FIGS. 9A to 9F show schematic cross-sectional views of electronic devices at different stages of the manufacturing process, according to some embodiments of the present disclosure. For the convenience of illustration, FIGS. 9A to 9F show the manufacturing method of forming the first reflective structure 310, and the second reflective structure 320 may also be formed by the same or similar method, but the present disclosure is not limited thereto. In some embodiments, the first reflective structure 310 and the second reflective structure 320 may be formed in the same process, or may be formed in different processes.

As shown in FIG. 9A, in some embodiments, a reflective material 310' is provided on a first base film 110. In some embodiments, the first bottom film 110 may be, for example, a carrier such as a releasing film, and the first bottom film 110 may be removed by other releasing process. The reflective material 310' may include a material used to form the first reflective structure 310. The reflective material 310' on the first base film 110 may be, for example, a flowable gel or semi-solid material. In some embodiments, the reflective material 310' may be, for example, pre-cured, according to requirements, so as to facilitate the manufacturing process.

As shown in FIG. 9B, in some embodiments, a substrate 100 is provided. A plurality of light-emitting elements 200 is disposed on the substrate 100. For ease of illustration, although one light-emitting element 200 is shown in FIG. 9B, the plurality of light-emitting elements 200 may be disposed on the substrate 100 according to the requirements. In some embodiments (not shown), wires, functional layers, circuit structures, the like or a combination thereof may be additionally provided, but the present disclosure is not limited thereto.

As shown in FIG. 9C, in some embodiments, the structure shown in FIG. 9A is reposted onto the structure shown in FIG. 9B. In some embodiments, the reflective material 310' is disposed on the substrate 100 and the plurality of light-emitting elements 200. For example, the structure shown in FIG. 9A is turned upside down and bonded, so that the reflective material 310' is in contact with the light-emitting element 200. That is, the reflective material 310' may be located between the first base film 110 and the substrate 100. In some embodiments, the reflective material 310' may cover the surfaces of the light-emitting element 200 and the substrate 100. Next, the first base film 110 for carrying the reflective material 310' is removed.

As shown in FIG. 9D, in some embodiments, a first mask 111 is disposed on the reflective material 310'. The first mask 111 is, for example, a patterned mask, and the first mask 111 may have an opening (i.e., a portion without the first mask 111). In some embodiments, the reflective material 310' may be a positive photoresist or a negative photoresist. The Positive photoresist is, for example, a photoresist in which a portion not illuminated by the light remains after development, while negative photoresist is, for example, a photoresist in which a portion illuminated by the light remains after development.

Figure 9F:
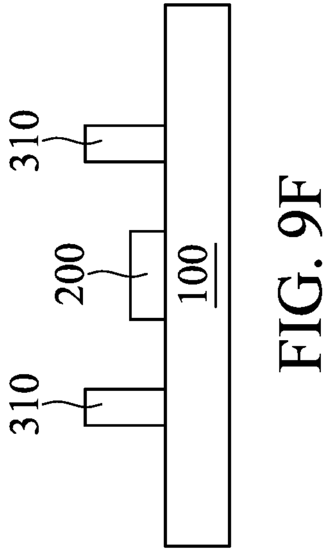
Figure 9E:
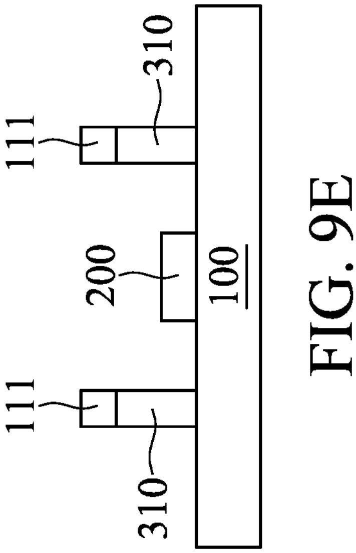

As shown in FIG. 9E, in some embodiments, the reflective material 310' is patterned by a photolithography process (a yellow light process), to form the first reflective structure 310 between adjacent two of the plurality of light-emitting elements 200. In detail, the reflective material 310' is patterned by performing the photolithography process by using the first mask 111 to form the first reflective structure 310 between adjacent two of the plurality of light-emitting elements 200. In other words, the material of the first reflective structure 310 includes photoresist. Referring to FIG. 3 together, the first reflective structure 310 may be located between two adjacent light-emitting elements 200 of the light-emitting elements 200. In FIG. 9D, for ease of illustration, the cross-sectional shape of the first reflective structure 310 is shown as a rectangle, but the present disclosure is not limited thereto. As shown in FIG. 9D and FIG. 9E, the reflective material 310' is, for example, the positive photoresist. The opening of the first mask 111 (i.e., the portion without the first mask 111) may expose a portion of the reflective material 310' which does not need to be remained after development, and the first mask 111 covers another portion of the reflective material 310' which needs to be remained after development, but the present disclosure is not limited thereto.

As shown in FIG. 9F, in some embodiments, the first mask 111 on the first reflective structure 310 is removed. In some embodiments, the electronic device of the present disclosure may be obtained or obtained by performing further processing.

FIGS. 10A to 10E show schematic cross-sectional views of electronic devices at different stages of the manufacturing process, according to some embodiments of the present disclosure. For the convenience of illustration, FIGS. 10A to 10E show the manufacturing method of forming the first reflective microstructure 410, and the second reflective microstructure 420 may also be formed by the same or similar method, but the present disclosure is not limited thereto. In some embodiments, the first reflective microstructure 410 and the second reflective microstructure 420 may be formed in the same process, or may be formed in different processes.

Figure 10B:
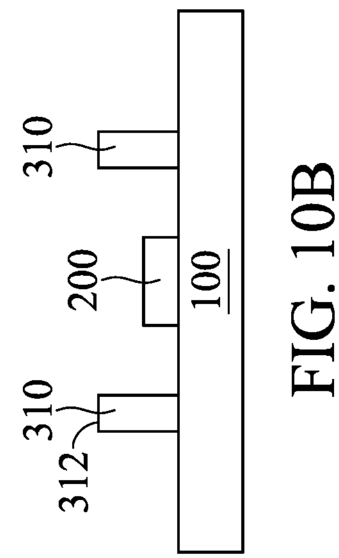
FIGS. 10A to 10E show schematic cross-sectional views of electronic devices at different stages of the manufacturing process, according to some embodiments of the present disclosure.
Figure 10A:
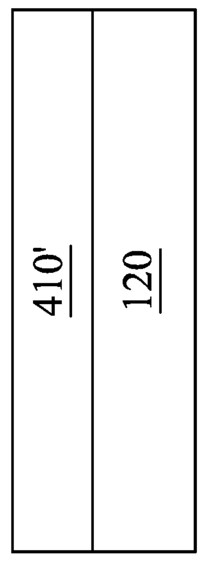

As shown in FIG. 10A, in some embodiments, a reflective microstructure material 410' is provided on the second base film 120. In some embodiments, the second base film 120 may be the same as or different from the first base film 110. In some embodiments, the second base film 120 may be a carrier such as a releasing film. In some embodiments, the second bottom film 120 may be removed by other releasing process. The reflective microstructure material 410' may include a material used to form the first reflective microstructure 410. In some embodiments, the reflective microstructure material 410' may be, for example, a flowable gel or semi-solid material. In some embodiments, the reflective microstructure material 410' may be, for example, pre-cured, according to requirements, to facilitate the manufacturing process.

As shown in FIG. 10B, a structure as shown in FIG. 9F is provided.

Figure 10D:
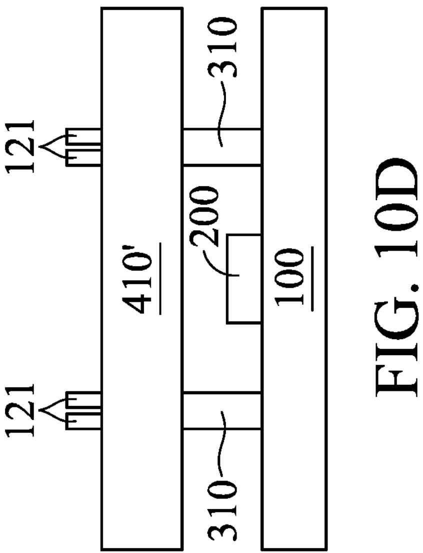
Figure 10C:

As shown in FIG. 10C, in some embodiments, the structure shown in FIG. 10A is reposted onto the structure shown in FIG. 10B. For example, the structure shown in FIG. 10A is turned upside down and bonded, so that the reflective microstructure material 410' is in contact with the first top surface 312 of the first reflective structure 310. The reflective microstructure material 410' and the top surface SB of the light-emitting element 200 (i.e., the top surface away from the substrate 100) may, for example, be separated by a distance. That is, for example, the reflective microstructure material 410' is not in contact with the top surface SB of the light-emitting element 200. In some embodiments, the reflective microstructure material 410' may cover the first top surface 312 of the first reflective structure 310. Next, the second bottom film 120 for carrying the reflective microstructure material 410' is removed.

As shown in FIG. 10D, in some embodiments, a second mask 121 is disposed on the reflective microstructure material 410'. The second mask 121 may be a patterned mask, and the second mask 121 may have an opening (i.e., a portion without the second mask 121). In some embodiments, the reflective microstructure material 410' and the reflective material 310' may be the same or different. In FIG. 10D, the reflective microstructure material 410' may be a positive photoresist, but the present disclosure is not limited thereto.

Figure 10E:
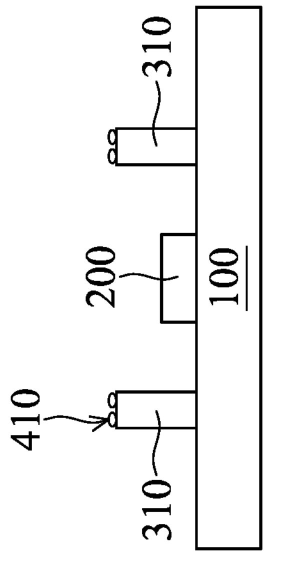

As shown in FIG. 10E, in some embodiments, the reflective microstructure material 410' is patterned by a photolithography process (a yellow light process) using the second mask 121, to form the first reflective microstructure 410 on the first reflective structure 310. Next, the second mask 121 on the first reflective microstructure 410 is removed.

To sum up, according to the embodiments of the present disclosure, an electronic device including a reflective structure is provided. The light scattering and/or reflection of the electronic device is increases by using reflective components such as reflective structures, reflective microstructures, and/or reflective elements. Thus, the utilization efficiency of the light is increased, the visual effect of the light is more uniform, and/or the overall brightness of the electronic device is improved. According to the embodiments of the present disclosure, a method for manufacturing an electronic device is provided. Thus, by using the photolithography process, the problem of being unable to adjust the shape of the reflective components due to process limitations is overcame, the dimensional accuracy (tolerance) of the reflective components is improved, the process yield and the reliability are improved, and/or the efficiency of the process is improved.

Although the embodiments of the present disclosure and their advantages have been disclosed above, it should be understood that a person of ordinary skills in the art may make changes, substitutions, and modifications without departing from the spirit and scope of the present disclosure. The features among the various embodiments may be arbitrarily combined as long as they do not violate or conflict with the spirit of the disclosure. In addition, the scope of the present disclosure is not limited to the process, machine, manufacturing, material composition, device, method, and step in the specific embodiments described in the specification. A person of ordinary skill in the art will understand current and future process, machine, manufacturing, material composition, device, method, and step from the content disclosed in some embodiments of the present disclosure, as long as the current or future process, machine, manufacturing, material composition, device, method, and step performs substantially the same functions or obtain substantially the same results as the present disclosure. Therefore, the scope of the present disclosure includes the abovementioned process, machine, manufacturing, material composition, device, method, and steps. The protection scope of the present disclosure should be defined by the scope of claims. It is not necessary for any embodiment or claim of the present disclosure to achieve all of the objects, advantages, and/or features disclosed herein.

The foregoing outlines features of several embodiments of the present disclosure, so that a person of ordinary skill in the art may better understand the aspects of the present disclosure. A person of ordinary skill in the art should appreciate that, the present disclosure may be readily used as a basis for designing or modifying other processes and structures for carrying out the same purposes and/or achieving the same advantages of the embodiments introduced herein. A person of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. An electronic device, comprising:

a substrate;

a plurality of light-emitting elements disposed on the substrate; and a reflective structure disposed on the substrate and located between adjacent two of the plurality of light-emitting elements, wherein a thickness of the reflective structure is designated as Y1, half of a pitch between the adjacent two of the plurality of light-emitting elements is designated as X1, and a light emitted by one of the adjacent two of the plurality of light-emitting elements has an emitting angle, and half of the emitting angle is designated as θ, and X1, θ, and Y1 conform to the following relationship:

$$X1 \times 0.5 \times \tan(90-\theta) \leq Y1 \leq X1 \times 1.8 \times \tan(90-\theta),$$

wherein a material of the reflective structure comprises photoresist.

2. The electronic device as claimed in claim 1, further comprising:

a reflective microstructure disposed on the reflective structure.

3. The electronic device as claimed in claim 1, wherein the reflective structure has a first surface adjacent to the substrate and a second surface away from the substrate, and a width of the first surface is smaller than a width of the second surface.

4. The electronic device as claimed in claim 1, wherein the reflective structure has a first surface adjacent to the substrate and a second surface away from the substrate, and a width of the first surface is greater than a width of the second surface.

5. The electronic device as claimed in claim 1, wherein a cross-sectional shape of the reflective structure is a rectangle, a regular trapezoid, an inverted trapezoid, or a shape with a curved edge.

6. The electronic device as claimed in claim 1, wherein the thickness of the reflective structure is greater than a thickness of the plurality of light-emitting elements.

7. The electronic device as claimed in claim 1, further comprising:

a second reflective structure disposed on the substrate, wherein the one of the plurality of light-emitting elements is located between the reflective structure and the second reflective structure, and a thickness of the second reflective structure differs from the thickness of the reflective structure.

8. The electronic device as claimed in claim 7, wherein the thickness of the second reflective structure is greater than a thickness of the plurality of light-emitting elements.

9. The electronic device as claimed in claim 7, wherein the thickness of the second reflective structure is greater than the thickness of the reflective structure.

10. The electronic device as claimed in claim 7, wherein the thickness of the second reflective structure is designated as Y2, a peripheral pitch between the second reflective structure and the one of the plurality of light-emitting elements is designated as X2, and X2, θ, and Y2 conform to the following relationship:

$$X2 \times 1.8 \times \tan(90-\theta) \leq Y2 \leq X2 \times 2.5 \times \tan(90-\theta).$$

11. The electronic device as claimed in claim 10, wherein X1 and X2 conform to the following relationship:

$$X1 \times 0.8 \leq X2 \leq X1 \times 1.2.$$

12. The electronic device as claimed in claim 1, further comprising:

an optical film disposed on the substrate, wherein the plurality of light-emitting elements is between the optical film and the substrate.

13. The electronic device as claimed in claim 1, further comprising:

a protective structure disposed on the plurality of light-emitting elements.

14. An electronic device, comprising:

a substrate;

a plurality of light-emitting elements disposed on the substrate;

a reflective structure disposed on the substrate and located between adjacent two of the plurality of light-emitting elements; and a reflective microstructure disposed on the reflective structure, wherein the reflective microstructure has a microstructure width, and the microstructure width is greater than or equal to 0.08 mm and smaller than a width of a first top surface of the reflective structure.

15. An electronic device, comprising:

a substrate;

a plurality of light-emitting elements disposed on the substrate;

a reflective structure disposed on the substrate and located between adjacent two of the plurality of light-emitting elements, and a reflective element disposed between the substrate and the reflective structure, wherein the reflective element is located between the adjacent two of the plurality of light-emitting elements.

wherein the plurality of light-emitting elements is disposed along a first direction, and in the first direction, a minimum distance between the reflective element and one of the plurality of light-emitting elements is smaller than a minimum distance between the reflective structure and the one of the plurality of light-emitting elements, wherein a thickness of the reflective structure is designated as Y1, half of a pitch between the adjacent two of the plurality of light-emitting elements is designated as X1, and a light emitted by one of the adjacent two of the plurality of light-emitting elements has an emitting angle, and half of the emitting angle is designated as θ, and X1, θ, and Y1 conform to the following relationship:

$$X1 \times 0.5 \times \tan(90-\theta) \leq Y1 \leq X1 \times 1.8 \times \tan(90-\theta).$$

16. The electronic device as claimed in claim 15, wherein a material of the reflective element comprises photoresist.

* * * * *